US007133468B2

United States Patent
Carter, Jr. et al.

(10) Patent No.: US 7,133,468 B2
(45) Date of Patent: Nov. 7, 2006

(54) CONCURRENT FM SIGNAL RECEIVER

(75) Inventors: Charles H. Carter, Jr., Sunrise, FL (US); Amish Pravinbhai Shah, Plantation, FL (US)

(73) Assignee: Motorola, Inc., Schaumburg, IL (US)

( * ) Notice: Subject to any disclaimer, the term of this patent is extended or adjusted under 35 U.S.C. 154(b) by 712 days.

(21) Appl. No.: 10/272,890

(22) Filed: Oct. 17, 2002

(65) Prior Publication Data

US 2004/0076242 A1 Apr. 22, 2004

(51) Int. Cl.
*H03K 9/00* (2006.01)
*H04L 27/14* (2006.01)
*H04B 1/16* (2006.01)
*H04B 1/10* (2006.01)

(52) U.S. Cl. .................. 375/316; 375/326; 455/194.1; 455/296

(58) Field of Classification Search ............... 375/316, 375/326; 455/194.1–296
See application file for complete search history.

(56) References Cited

U.S. PATENT DOCUMENTS

| 4,334,317 | A | * | 6/1982 | Beesley | 455/194.1 |
| 4,455,664 | A | * | 6/1984 | Burke | 375/351 |
| 4,731,873 | A | * | 3/1988 | Voyce | 455/219 |
| 6,055,421 | A | * | 4/2000 | Zele et al. | 455/218 |
| 2004/0203551 | A1 | * | 10/2004 | Li et al. | 455/296 |

* cited by examiner

*Primary Examiner*—Khai Tran
*Assistant Examiner*—Cicely Ware

(57) ABSTRACT

A method and apparatus are provided which detects distortion in a received FM signal caused by amplitude modulating and phase transition of two combined FM signals. A method corrects and modifies the distortion by detecting a distorted sample, replacing the distorted sample with an appropriate sample, and applying a smoothing process to the sample.

4 Claims, 7 Drawing Sheets

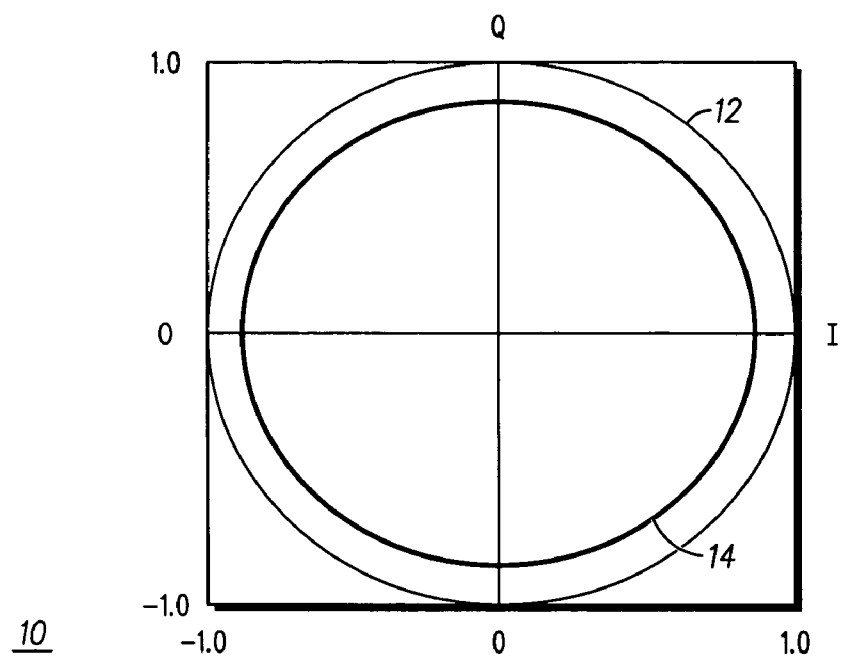
FIG. 1 —PRIOR ART—
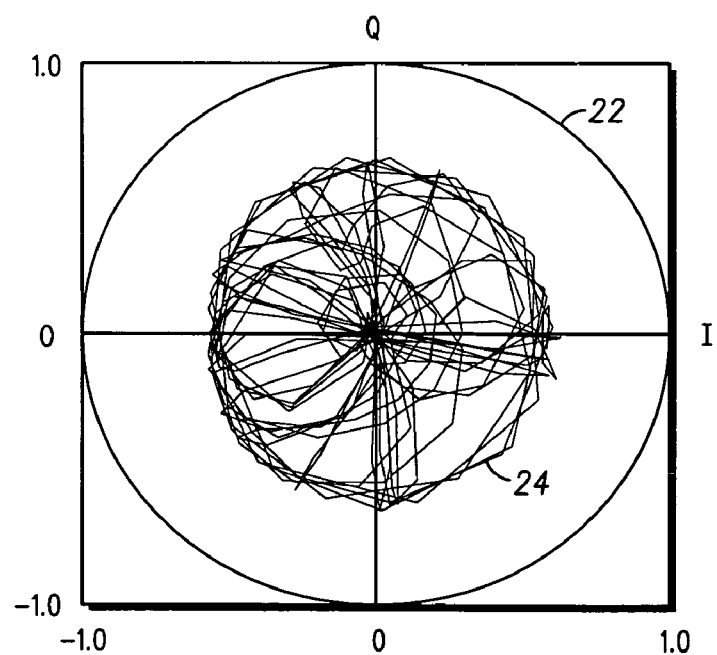
FIG. 2 —PRIOR ART—

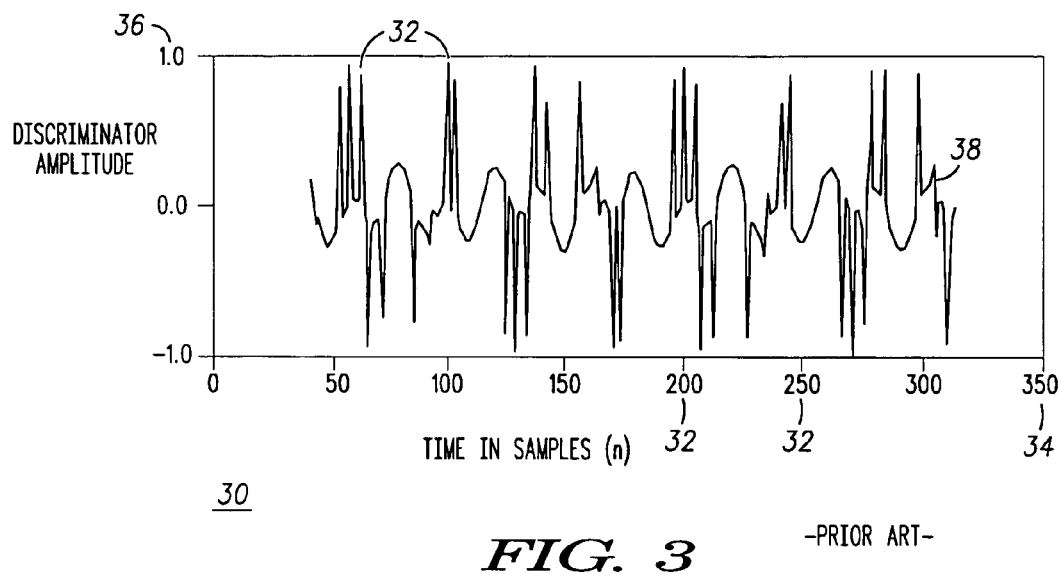
FIG. 3  -PRIOR ART-
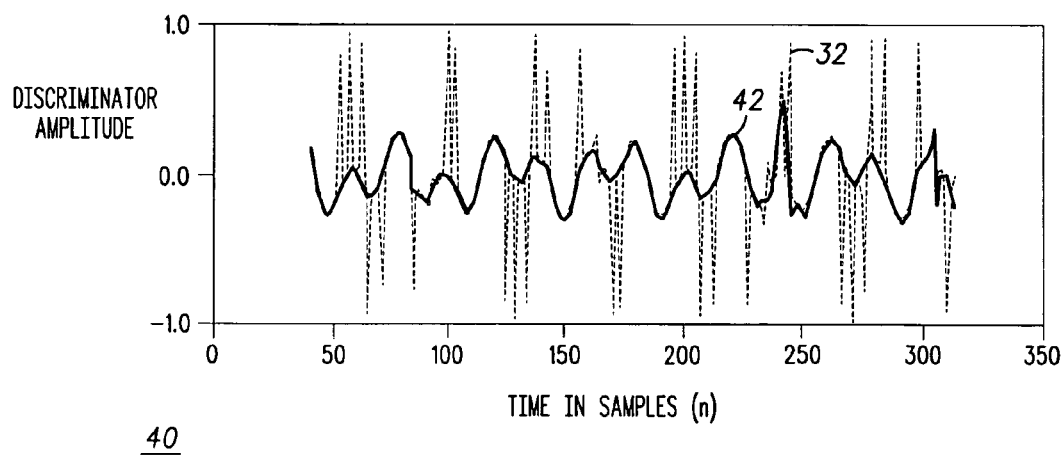
FIG. 4

US 7,133,468 B2

CONCURRENT FM SIGNAL RECEIVER

FIELD OF THE INVENTION

This invention relates generally to FM signal receivers and more particularly to concurrent FM signal receivers.

BACKGROUND OF THE INVENTION

Many public safety agencies, such a police and firefighter departments, employ radio communication systems that use a conventional Carrier Squelch (CSQ) repeater system. For example a typical fire ground scene can have many firefighters on the scene, in close proximity, all transmitting uncontrolled on a single voice channel. One problem that can arise with concurrent usage is blocked transmissions. Any system which receives analog frequency modulated (FM) voice transmission which can receive multiple transmissions on the same channel simultaneously (by design or accident), such as message trunking systems, carrier squelch, or DPL/PL systems to name just a few, are susceptible to such transmission blocking problems. Under these conditions the multiple transmissions have relatively similar signal strengths. Accordingly, it would be desirable to have improved FM radio operation environments that provide for concurrent transmissions on the same channel without blocking transmissions.

BRIEF DESCRIPTION OF THE DRAWINGS

The present invention is illustrated by way of example and not limitation in the accompanying figures, in which like references indicate similar elements, and in which:

FIG. 1 illustrates an example of a Pole-Zero plot of an FM signal illustrating a relatively constant magnitude signal with a rotating phase.

FIG. 2 is an example of a Pole zero-plot of two FM signals combined on the same channel.

FIG. 3 is a discriminator plot illustrating an example of a typical mixed FM signal.

FIG. 4 is a plot illustrating an example of a signal (solid line) processed in accordance with the present invention compared with the original distorted signal (dotted line.)

Figure 5:
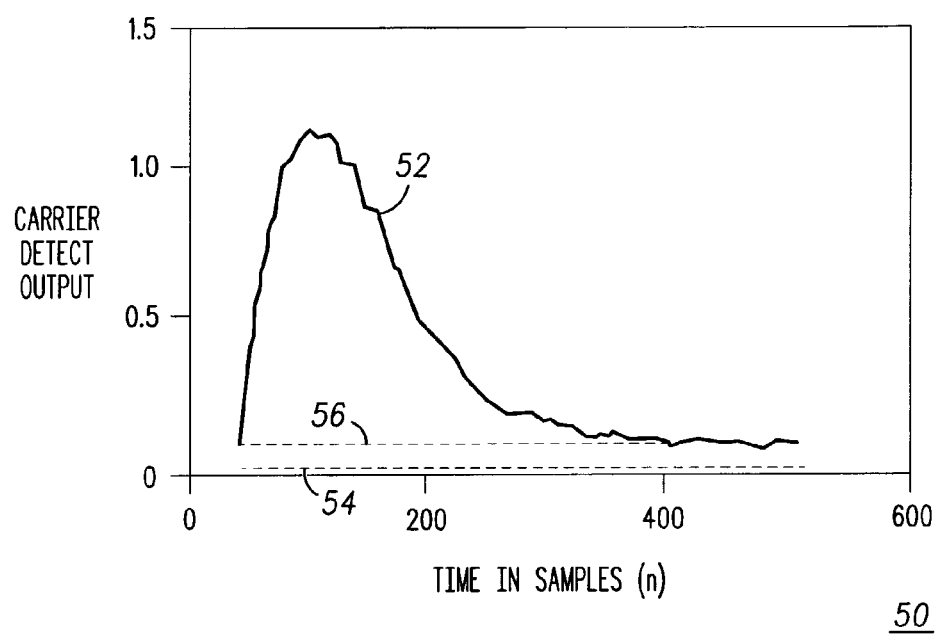
FIG. 5 is a plot of an example of carrier detect falsing on two overlapping FM signals.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF THE DRAWINGS

The apparatus and process of the present invention to be described herein provide a means to detect glitches/spikes in the received signal caused by amplitude modulating and phase transitions of two combined FM signals. The process corrects or modifies the spikes/glitches. The process and apparatus can further maintain the characteristics of a random signal when no signal is applied as well as provide a post filtering operation to improve the processed signal. The process and apparatus improve the operation of FM radios and improve the intelligibility of the multiple received voice messages A Frequency Modulate (FM) signal can be represented by the following formula:

$$fm(t)=\cos(\omega_c t+k_f\int m(t)dt)$$

where m(t) is the modulating information signal.

The information signal, m(t), is recovered in the receiver with a discriminator function which performs the following function on the Inphase (I) and Quadrature (Q) components fm(t). The discriminator function is defined as follows:

$$disc(t) = \frac{d\left(\arctan\left(\frac{Q}{I}\right)\right)}{dt}$$

where disc(t) is therefore a function of the rate of change of the phase of the FM signal and should be equivalent to m(t). FIG. 1 illustrates an example of a Pole-Zero plot of an FM signal illustrating a relatively constant magnitude signal with a rotating phase. Plot 10 shows I on the horizontal axis and Q on the vertical axis with a reference circle 12 representing a magnitude of 1. The inner circle represent magnitude and phase of a single typical FM signal.

When two signals are combined on the same channel they can be represented by the following formula:

$$fm(t)=A\cos(\omega_c t+k_f\int m(t)dt)+A'\cos(\omega_c t+\theta+k_f\int m'(t)dt)$$

where A and A' represent signal amplitude.

FIG. 2 is an example of a Pole Zero-plot of two FM signals combined on the same channel. Plot 20 shows I on the horizontal axis and Q on the vertical axis with a reference circle 22 representing a magnitude of 1. The inner signals 24 represent the two combined FM signals' magnitude and phase. FM has a characteristic known as the "capture effect". If two FM signals are on the same channel and vary in signal strength (amplitude) by approximately 6 dB or more, effectively the weakest signal is suppressed and the stronger signal is received. However, in the case where the signal strengths are close, interference occurs. In this case the received signal is not constant magnitude and importantly there are rapid phase transitions close to the origin. Although the phase path varies depending upon the phase and relative amplitudes of the two FM signals, the result is somewhat predictable glitches in the recovered discriminator signal.

FIG. 3 is a discriminator plot 30 illustrating an example of a typical mixed FM signal. In this case the plot represents the result of a 1 KHz modulating tone mixed with a 400 Hz modulating tone. The horizontal axis 34 represents time in samples (n) while the vertical axis 36 represents amplitude. The glitches/spikes 32 in the signal 38 drastically affect the noise characteristics of the received signal. Most FM receivers incorporate some method of carrier detection and squelch detection. In addition, other methods of signal validation exist such as Private Line (PL) and Digital Private Line (DPL), which are also affected. These functions are designed to determine when a signal is present (carrier detector) and whether the signal is of high enough quality for the radio to unmute and begin receiving (squelch detector). These functions usually measure noise, signal to noise ratio, and/or correlation of the signal. All of these characteristics are changed when two or more FM signals are combined. The result is the addition of unintelligible audio, and many times the audio is blocked due to carrier detect and squelch detect falsing.

In accordance with the present invention, the spikes 32 are removed and the signal 38 is smoothed. This improves the received audio quality and improves performance of carrier detect and squelch processes. In this implementation, the spikes are detected by computing the derivative of the received discriminator signal, however the present invention is not necessarily limited to this method. The spikes are usually associated with a high rate of change and may or may not have a large measurable amplitude. In accordance with this implementation, the derivative of each sample is compared to an empirically determined threshold. If the value exceeds the threshold, the sample is replaced utilizing the following preferred embodiment.

In the preferred embodiment of the invention, a "bad" value is substituted with a value two samples in the future or (n+2). This is done for two reasons. Firstly, the spikes can vary in width, but do not typically exceed several samples. So the substitution of a "random signal from several samples in the future" helps assure that a similar sample value is substituted, but not from the spike. Secondly, if there is no carrier present and random noise predominates, it is not desirable to smooth or correlate the signal. This can fool the carrier detect and squelch algorithms into thinking a signal is present when in fact there is no signal present. By substituting a random signal from several samples in the future, some randomness and low correlation can be maintained when a carrier is not present. The resultant signal is low pass filtered to smooth the received signal.

FIG. 4 is a plot illustrating an example of a signal processed in accordance with the present invention compared with an original distorted signal (dotted line). FIG. 4 shows the results of processing on the 1 KHz and 400 Hz interfering FM signals. The dashed line 32 represents the original signal. The solid line 42 represent the signal processed in accordance with the preferred embodiment.

Figure 6:
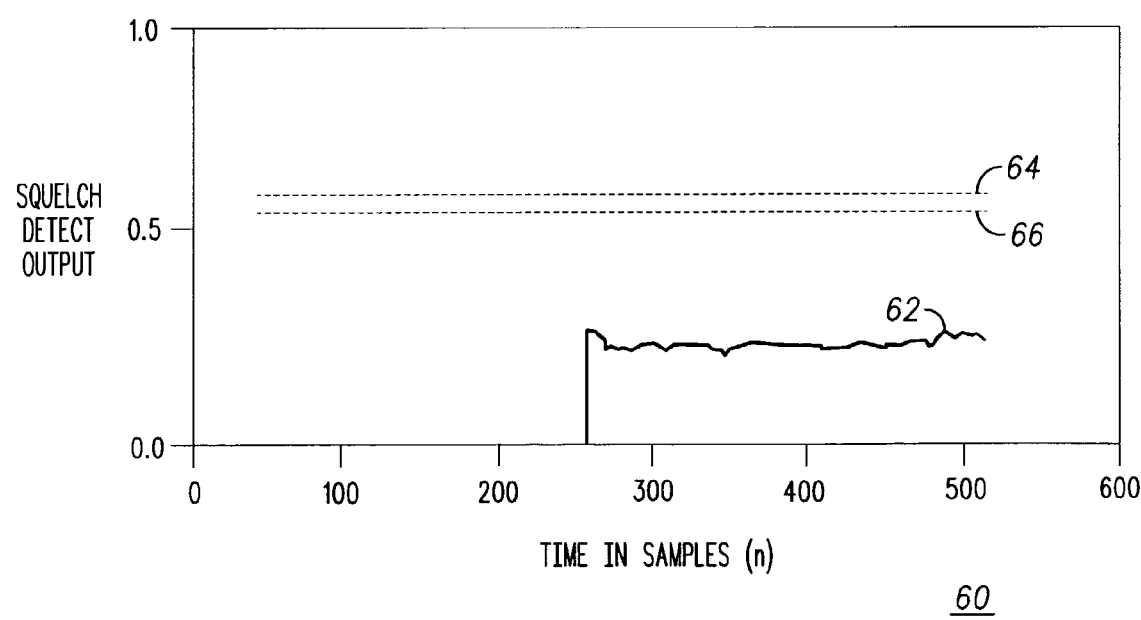
FIG. 6 is a plot of an example of squelch detect falsing on two overlapping FM signals.
Figure 7:
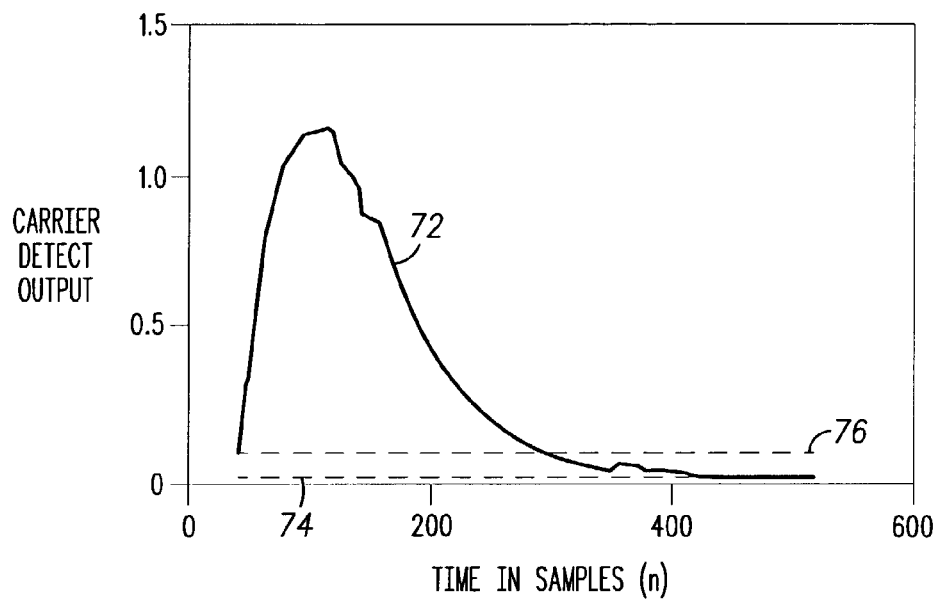
FIG. 7 a plot of carrier detect functioning properly on two overlapping signals which have been processed in accordance with the present invention.
Figure 8:
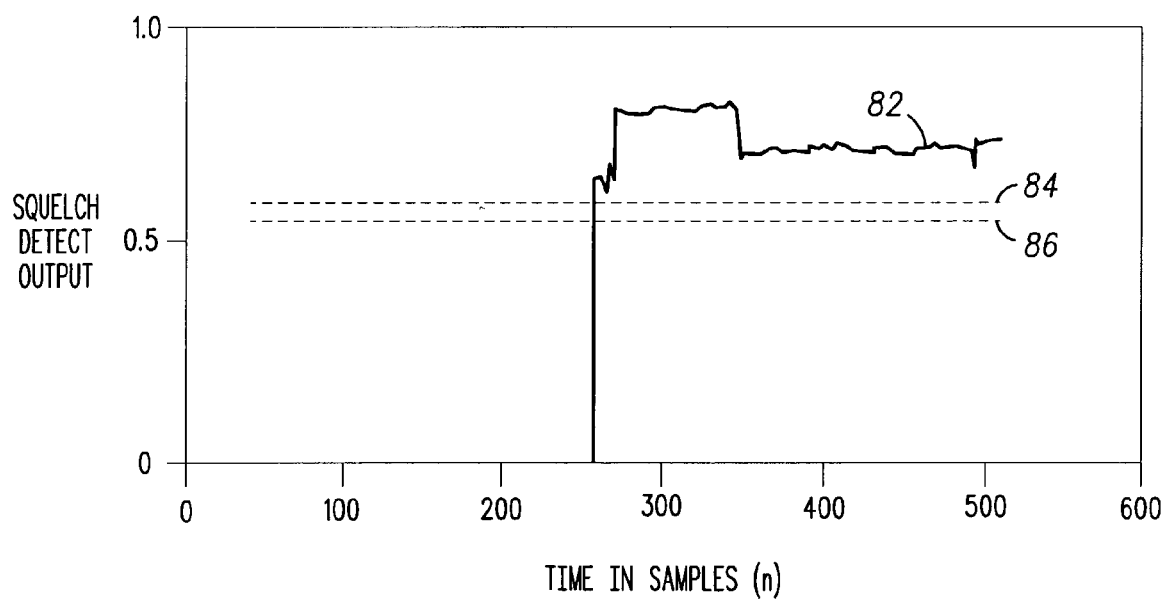
FIG. 8 is a plot of squelch detect functioning properly on two overlapping FM signal which have been processed in accordance with the present invention.
Figure 9:
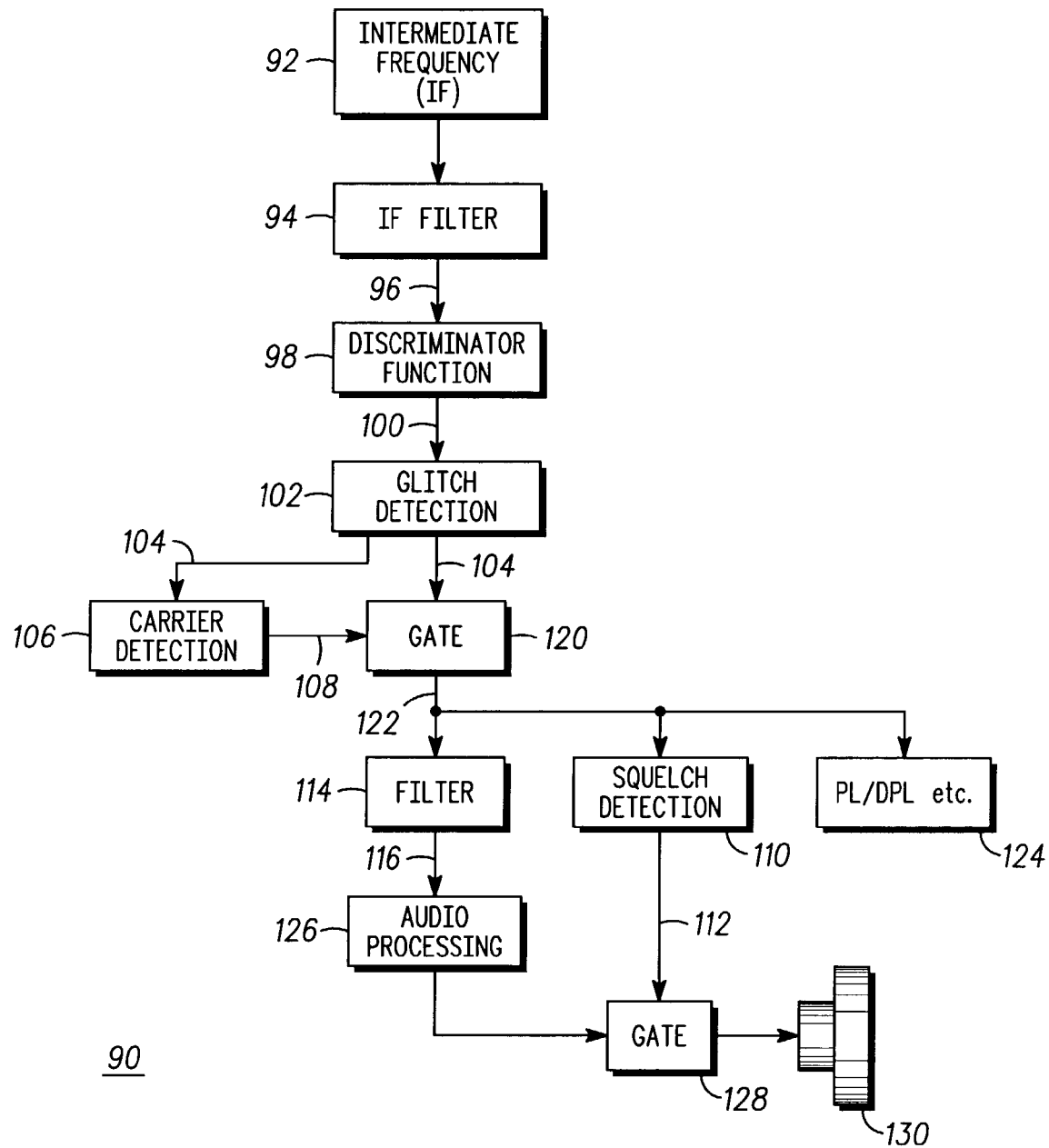
FIG. 9 is a block diagram of an improved FM receiver system in accordance with the present invention.

The next two plots, FIGS. 5 and 6, are representative of the carrier detect 50 and squelch detect 60 functions. These plots represents results prior to processing with the 1 HZ and 400 HZ interference signals. The horizontal axis represents time in samples (n) while the vertical axis measures magnitude of the carrier detect output. Plot 50 shows the carrier detect falsing on two overlapping FM signals. Solid line 52 represents carrier detect, dashed line 56 represents undetected carrier, and dashed line 54 represents detect threshold. Plot 60 shows the squelch detect falsing on two overlapping FM signals. Solid line 62 represents squelch detect magnitude, dashed line 64 represents squelch detect threshold, and dashed line 66 represents squelch undetect threshold. As can be seen in FIGS. 5 and 6, carrier detect and squelch detect are never achieved The same plots are regenerated in FIGS. 7 and 8 with the signal processed in accordance with the present invention. FIG. 7 is a plot 70 of carrier detect functioning properly on two overlapping signals which have been processed in accordance with the present invention. Solid line 72 represents carrier detect, dashed line 76 represents undetected carrier, and dashed line 74 represents carrier threshold. FIG. 8 is a plot of squelch detect functioning properly on two overlapping FM signal which have been processed in accordance with the present invention. Solid line 82 represents squelch detect, dashed line 84 represents squelch detect threshold, and dashed line 86 represents squelch undetect threshold. As can be seen in FIGS. 7 and 8, carrier detect and squelch detect are now achieved FIG. 9 is a block diagram of an improved FM receiver system in accordance with the present invention. Receiver system 90 includes an input 92 for receiving an intermediate frequency (IF) signal. A filter 94 is included for receiving the IF signal and generating a filtered signal 96. A discriminator 98 is coupled to the filter for receiving the filtered signal and providing a recovered signal 100. A glitch detector 102 is coupled to the discriminator for determining and removing glitches in the recovered signal 100 and generating a processed signal 104. A carrier detector 106 is present for receiving the processed signal 104 and generating a carrier detect signal 108. The processed signal 104 or carrier detect signal 108, is gated through gate 120. The gated signal 122 continues on to a filter 114, a squelch detector 110, and other functions as needed for the particular receiver, for example, a PL/DPL circuit 124. The squelch detector 110 is present for generating a squelch detect signal 112 to unmute the receiver based on the quality of the processed signal. The filter 114 is used for filtering the processed signal and generating a filtered processed signal 116. The filtered processed signal 116 is processed through audio processing 126 and then gated, as is the squelch detect signal 112, through gate 128 to speaker 130. Thus, the carrier detect signal 108, the squelch detect signal 112, and the filtered processed signal 116 all gate the audio processing circuitry.

Figure 10:
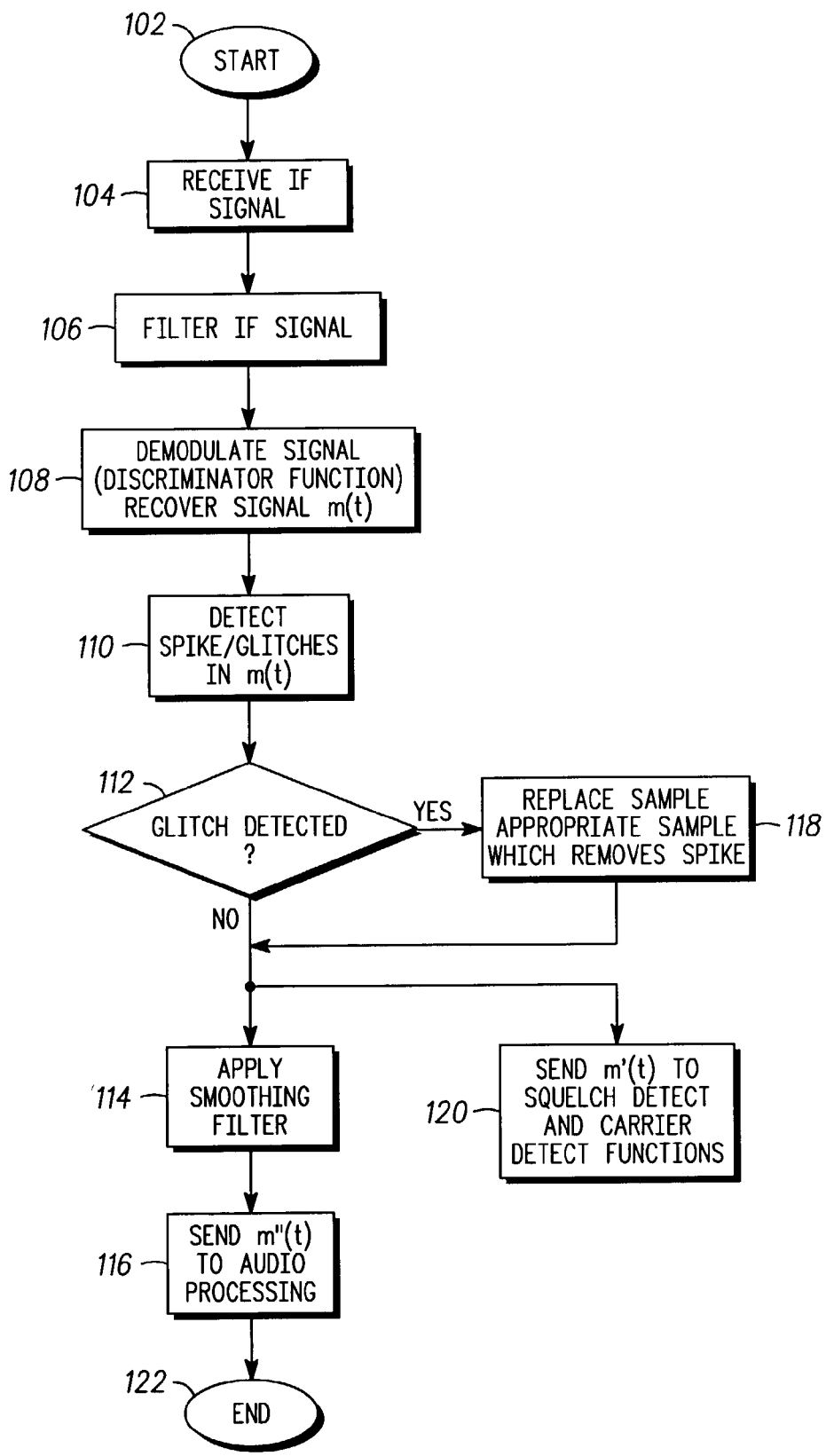
FIG. 10 is a flow chart of a process for improving FM reception in accordance with the present invention.

FIG. 10 is a flow chart of a process 100 for improving FM reception in accordance with the present invention. A method for minimizing distortion in an FM receiver, begins at step 102 and comprises receiving an intermediate frequency (IF) signal having multiple signals in a given signal path 104, filtering the IF signal 106, applying a predetermined discriminator function to the filtered IF signal to generate a recovered signal 108, detecting a spike(s) in a sample of the recovered signal 110, processing the sample of the recovered signal to replace the spike with an appropriate substitute sample thereby generating a resultant signal 118 if glitch was detected at 112, then smooth the resultant signal at 114 and apply audio processing to the smoothed resultant signal at 116. Also, if no glitch is detected at 112, the clean signal m'(t) goes directly to squelch detect and carrier detect functions 120 as well as smoothing function performed at 114.

Figure 11:
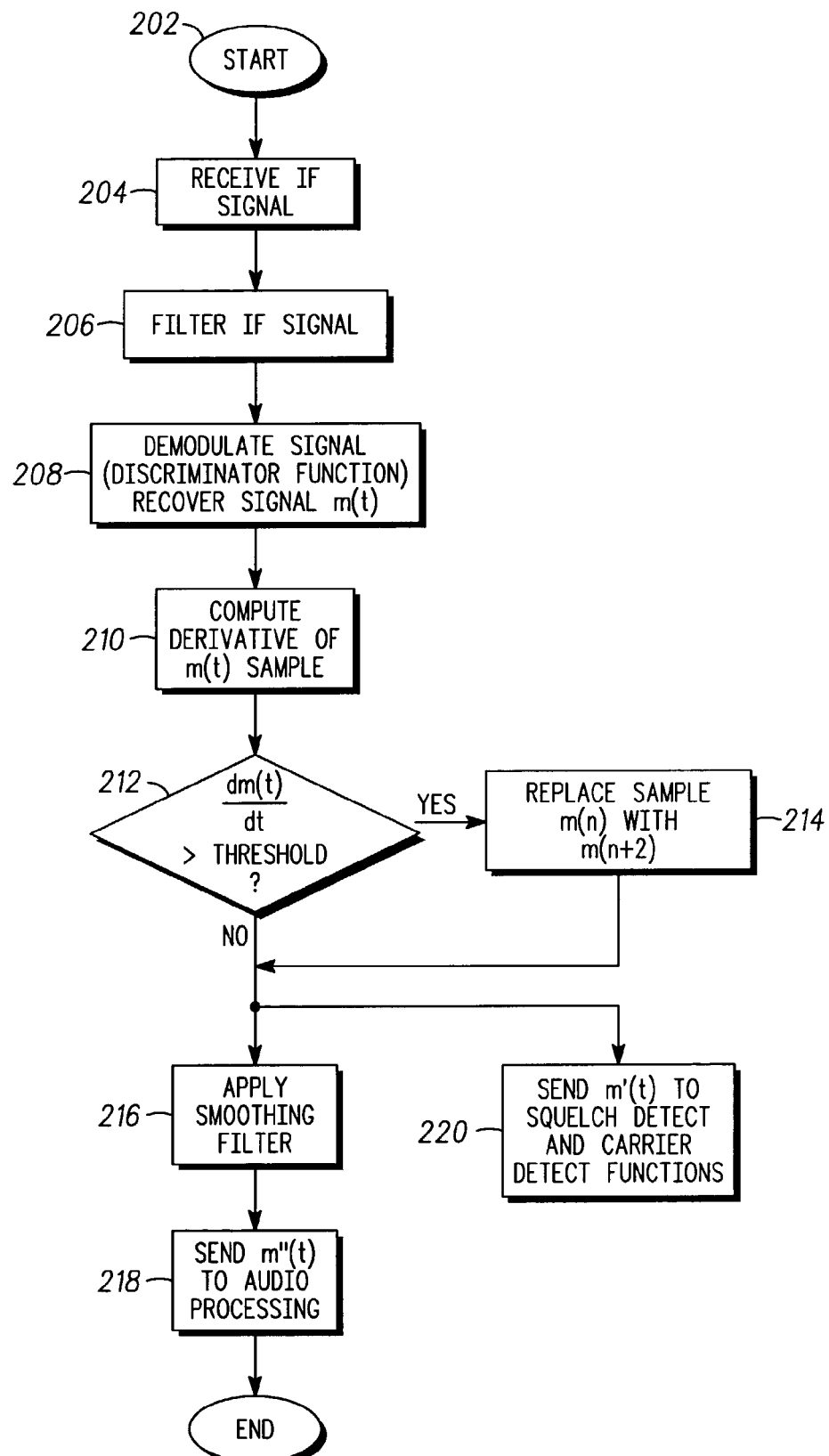
FIG. 11 is flow chart showing a preferred embodiment of the process of the present invention.

FIG. 11 is flow chart showing a preferred embodiment of the process of the present invention which utilizes a specific implementation of the random signal from several samples in the future. Flowchart 200 begins at 202 and receives an IF signal at 204. The IF signal is filtered at 206 and the filtered IF signal is demodulated at step 208 using a discriminator function to generate a recovered signal m(t). Next the derivative of the m(t) sample is computed at 210. If the derivative exceeds a threshold value at step 212 the sample is replaced with m(n) 214, a random signal from several samples in the future, in this example m(n+2). The replaced sample is then smoothed at 216 and sent as m"(t) to audio processing 218. If the threshold was not exceeded at step 212 then the derivative signal m'(t) goes to squelch and carrier detect functions 220.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential features or elements of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

We claim:

1. A method for minimizing distortion in an FM receiver, comprising:
    receiving an intermediate frequency (IF) signal having multiple signals in a given signal path;
    filtering the IF signal;
    applying a predetermined discriminator function to the filtered IF signal to generate a recovered signal;
    detecting a spike in a sample of the recovered signal;
    processing the sample of the recovered signal to replace the spike with an appropriate substitute sample thereby generating a resultant signal, wherein the step of processing the sample comprises taking a derivative of the sample, and wherein the step of taking the derivative further comprises comparing the derivative to a predetermined threshold, and wherein a future sample is substituted for the sample of the recovered signal having a spike when the derivative is above the predetermined threshold;
    smoothing the resultant signal; and
    applying audio processing to the smoothed resultant signal.

2. A receiver, comprising:
    a filter for receiving an IF signal and generating a filtered signal;
    a discriminator for receiving the filtered signal and providing a recovered signal;
    a glitch detector for determining and removing signal conditions in which the magnitude of the IF signal crosses close to or through an I/Q origin caused by multiple concurrent signal present in the recovered signal and generating a processed signal;
    a carrier detector for receiving the processed signal and generating a carrier detect signal;
    a squelch detector for generating a squelch detect signal to unmute the receiver based on the quality of the processed signal;
    a filter for filtering the processed signal and generating a filtered processed signal;
    audio processing circuitry for receiving the carrier detect signal, the squelch detect signal, and the filtered processed signal; and
    the carrier detect signal, the squelch detect signal, and the filtered processed signal all gating the audio processing circuitry.

3. A method for minimizing distortion in a received FM signal, comprising:
    receiving a signal having distortion caused by amplitude modulating and phase transition of two combined FM signals;
    modifying the signal by detecting a distorted sample; and
    replacing the distorted sample with a random sample from several samples in the future.

4. A method for minimizing distortion in an FM receiver, comprising:
    receiving an intermediate frequency (IF) signal having multiple signals in a given signal path;
    filtering the IF signal;
    applying a predetermined discriminator function to the filtered IF signal to generate a recovered signal;
    detecting a spike in a sample of the recovered signal, wherein the spike is based on I/Q origin crossings caused by multiple concurrent signals;
    processing the sample of the recovered signal to replace the spike with an appropriate substitute sample thereby generating a resultant signal;
    smoothing the resultant signal
    applying audio processing to the smoothed resultant signal.

* * * * *